(12) United States Patent
Jin et al.

(10) Patent No.: US 6,614,271 B1
(45) Date of Patent: Sep. 2, 2003

(54) SIGNAL DETECT CIRCUIT FOR HIGH SPEED DATA RECEIVERS

(75) Inventors: Robert X. Jin, San Jose, CA (US); Kathy L. Peng, Union City, CA (US); Stephen F. Dreyer, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/171,071

(22) Filed: Jun. 13, 2002

(51) Int. Cl.$^7$ .......................... H03K 5/153; H03K 5/22
(52) U.S. Cl. ............................. 327/77; 327/78
(58) Field of Search ..................... 327/65, 74, 76, 327/77, 78, 79, 80, 88, 89

(56) References Cited

U.S. PATENT DOCUMENTS 5,999,577 A * 12/1999 Kawai ........................ 375/334
6,377,082 B1 * 4/2002 Loinaz et al. ................ 327/20
6,437,606 B1 * 8/2002 Ranieri et al. ............... 327/74

* cited by examiner

Primary Examiner—Tuan T. Lam
(74) Attorney, Agent, or Firm—Trop, Pruner & Hu, P.C.

(57) ABSTRACT

In accordance with one embodiment of the present invention, a signal detect circuit may analyze an input signal before passing it on to a receiver. The analysis may be done outside of the data path to avoid affecting the data path speed or adding distortion or jitter. The positive and negative thresholds of the data may be checked to see if the numbers of positive and negative crossings are comparable. Random and bursty noise can be detected since such noise normally does not have comparable positive and negative crossings.

16 Claims, 2 Drawing Sheets

SIGNAL DETECT CIRCUIT FOR HIGH SPEED DATA RECEIVERS

BACKGROUND

This invention relates generally to receivers including signal detect circuits.

When high speed data signals are transmitted over a given media (wire, fiber optics, traces, etc.), the data signals may be degraded by noise and crosstalk picked up along the path between receiver and transmitter. At the receiver end, it is sometimes useful to know whether the input data signal is valid or fatally degraded by noise or crosstalk. As such, data receivers sometimes have a signal detect function to detect whether the input signal is valid.

One way to implement the signal detect function is to look for coding errors in the data stream. If the error rate exceeds a predetermined amount, then the signal is determined to be invalid. This method works well when the coding algorithm can reliably detect very low bit error rates, and the noise corrupting the data causes errors that violate the coding rules for the channel, i.e., the noise is from a source that is not the same as the data being monitored.

One limitation of this method is that it cannot detect crosstalk from an adjacent data channel with the same type of coding. This limitation arises because the interfering crosstalk signal may produce enough noise that meets all the coding requirements of the channel being monitored so that the error detector cannot discern between a valid signal and the crosstalk signal.

Another method used for the signal detect function is to compare the input signal amplitude against a preset threshold. If the input signal amplitude exceeds the preset threshold, then the signal is considered valid. This method is able to reject data transitions due to crosstalk and noise provided the crosstalk and noise amplitude is less than the threshold amplitude.

One limitation of this method is that doing the threshold comparison in the signal path causes duty cycle distortion at the output of the comparator, introducing jitter onto the data signal. A second limitation of this method is that if the interfering noise or crosstalk is greater than the threshold amplitude, this method will indicate that the signal is valid when it actually is invalid. A third limitation with this method is that introducing a threshold comparison in a data path typically degrades the speed of the input comparator, which may pose problems in high speed circuits.

A third method used for signal detect is to do a peak detect on the input signal, integrate it over a long period, and compare it to a preset threshold. One limitation of this method is that if the interfering noise or crosstalk is greater than the threshold amplitude, this method will indicate that the signal is valid when it actually is invalid.

Thus, there is a need for ways of implementing the signal detect function that overcomes one or more problems associated with existing methods.

DETAILED DESCRIPTION

Figure 1:
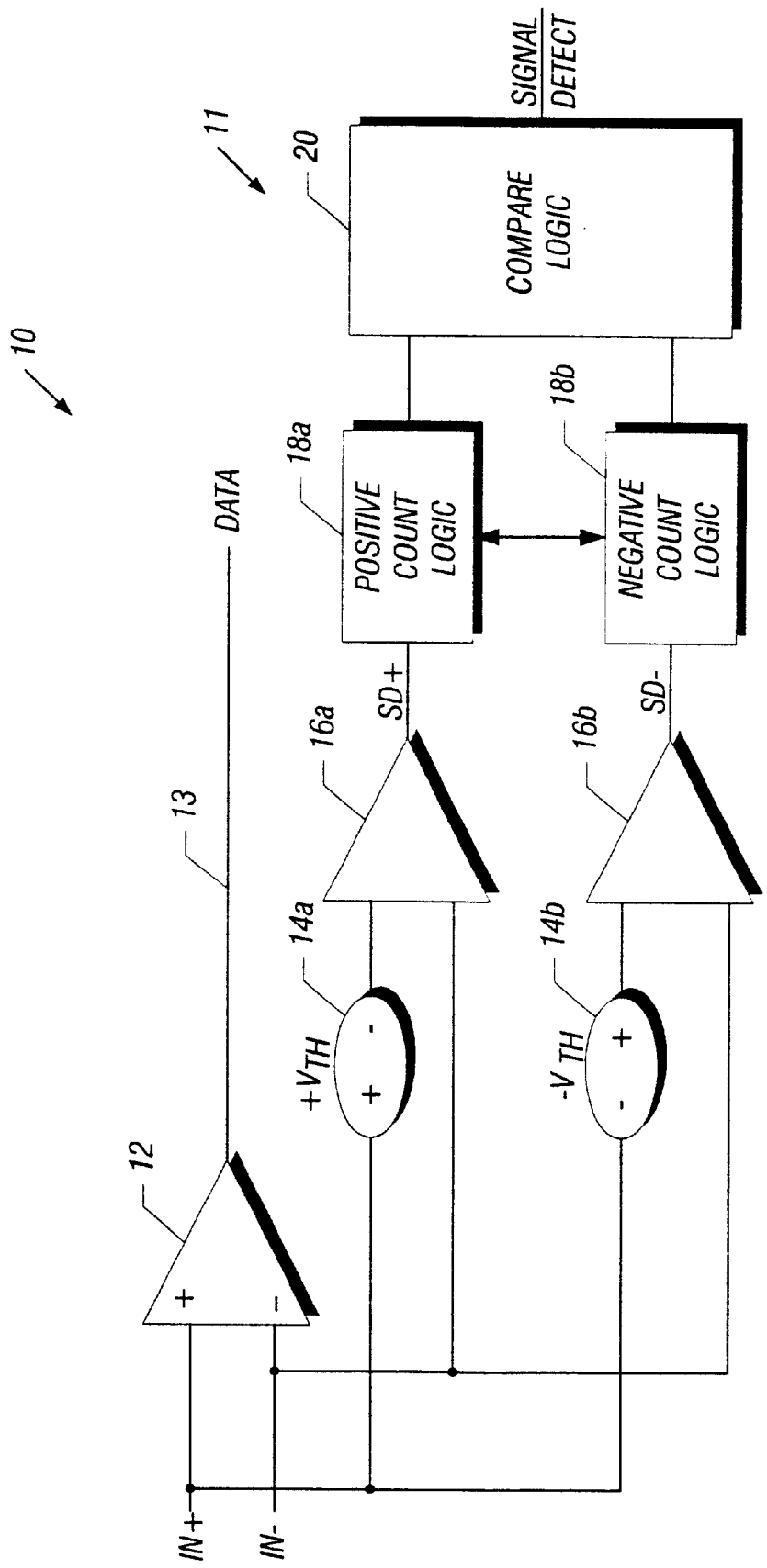
FIG. 1 is a schematic depiction of one embodiment of the present invention.

Referring to FIG. 1, receiver 10 includes a signal detect circuit 11 with two comparators 16 that are not placed in the data path 13 of the input data IN+, IN- to the input comparator 12. The comparator 16a trips when the input signal (IN+) exceeds a positive threshold provided by a threshold voltage source 14a. The comparator 16b trips when the input signal (IN-) exceeds a negative threshold determined by a threshold voltage source 14b.

The output of each comparator 16 goes to the count logic 18. The positive count logic 18a increments once when the input signal (SD+) exceeds a positive threshold. The negative count logic 18b increments once when the input signal (SD-) exceeds the negative threshold. The increments for both positive and negative count logic 18 is shown in FIG. 2.

The counts of the positive and negative count logic 18a, 18b are compared after a very long time by the compare logic 20. If the positive and negative counts are relatively close and less than a specified difference, then the signal is considered valid. If not, then the signal is invalid.

Figure 2:
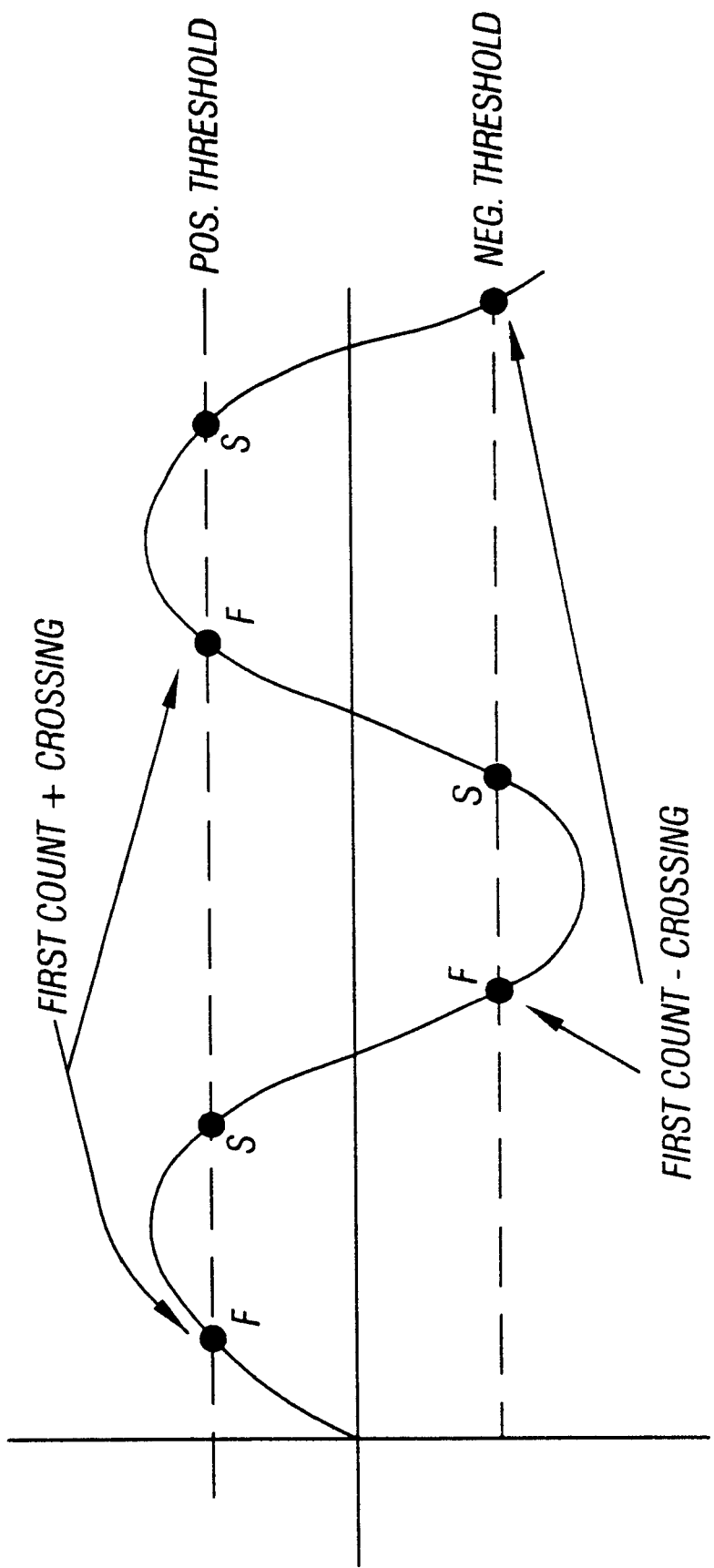
FIG. 2 is a hypothetical waveform in accordance with one embodiment of the present invention.

The first positive threshold ("F") is counted and not the second threshold as ("S") as indicated in FIG. 2 in some embodiments. This reduces the effect of noise that may cause multiple triggers and thus many spurious counts, affecting the quality of the signal detect function.

Since the signal detect circuit 11 is not in the data path 13 of the receiver 10 in some embodiments, the circuit 11 does not affect the data path speed or add any distortion or jitter. Because the signal detect circuit 11 counts the positive and negative threshold crossings and compares them to see if the number of crossings are approximately the same in some embodiments, random and bursty noise can be detected since such noise usually does not have equal positive and negative transitions.

If the transition density of the data is known, the counts from the positive and negative count logic can be checked to see if the counts meet the transition density range that the data should be in. If not, then the inputs to the receiver are noise, not data, and the signal is not valid.

Another modification is to compare the counts from a zero crossing data comparator against the counts from the threshold comparators 14. If the counts match, then the signal is valid. If not, then the signal is noise or crosstalk.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   receiving a signal on a data path;
   using a circuit that is not placed in the data path to develop a count of the number of positive and negative excursions of said signal; and
   determining whether the number of positive and negative excursions of said signal indicates that the signal is a valid signal.

2. The method of claim 1 wherein determining whether the number of positive and negative excursions of said signal indicate that the signal is a valid signal includes determining whether the number of positive and negative excursions are approximately equal.

3. The method of claim 2 including comparing a positive excursion to a positive threshold voltage and comparing a negative excursion to a negative threshold voltage.

4. The method of claim 3 including counting the number of positive excursions that exceeds said positive threshold voltage and counting the number of negative excursions that exceeds said negative threshold voltage.

5. The method of claim 4 including incrementing a count once when a positive excursion exceeds the positive threshold voltage and incrementing a count when a negative excursion exceeds the negative threshold voltage.

6. The method of claim 5 including determining whether the counts for the positive and negative excursions are approximately the same.

7. The method of claim 6 including determining whether the counts are approximately the same and less than a specified difference.

8. A device comprising:
   a receiver having an input data path to receive an input signal;
   a signal detect circuit coupled to the input data path, said circuit comprising:
   a positive threshold detector to determine whether said input signal has a positive voltage above a predetermined threshold;
   a positive count logic to count the number of times that said positive threshold is exceeded;
   a negative threshold detector to determine whether the input signal has a negative voltage below a predetermined threshold; and
   a negative count logic to determine the number of times the negative threshold is exceeded.

9. The device of claim 8 including a comparator to compare the number of times that said signal exceeds said positive and negative thresholds.

10. The device of claim 9 wherein said comparator determines whether the number of times that said positive threshold was exceeded is approximately the same as the number of times that said negative threshold was exceeded.

11. The device of claim 8 wherein said positive threshold detector includes a first input coupled to said data path and the second input connected to a source of a positive threshold voltage.

12. A signal detect circuit comprising:
   a positive threshold detector to determine whether an input signal has a positive voltage above a predetermined threshold;
   a positive count logic to count the number of times that said positive threshold is exceeded;
   a negative threshold detector to determine whether the input signal has a negative voltage below a predetermined threshold;
   a negative count logic to determine the number of times the negative threshold is exceeded; and
   a comparator to compare the number of times that said input signal exceeds said positive and negative thresholds.

13. The device of claim 12 wherein said comparator determines whether the number of times that said positive threshold was exceeded is approximately the same as the number of times that said negative threshold was exceeded.

14. The device of claim 12 wherein said positive threshold detector includes a first input coupled to said data path and the second input connected to a source of a positive threshold voltage.

15. The device of claim 12 wherein said positive count logic increments only the first time that a voltage pulse crosses a positive threshold voltage and not when the same pulse crosses said voltage again.

16. The device of claim 15 wherein said positive count logic increments once when the positive pulse exceeds the positive threshold voltage and does not increment again until a negative pulse exceeds a negative threshold voltage.

* * * * *

UNITED STATES PATENT AND TRADEMARK OFFICE
CERTIFICATE OF CORRECTION

PATENT NO.    : 6,614,271 B1
DATED         : September 2, 2003
INVENTOR(S)   : Robert X. Jin, Kathy L. Peng and Stephen F. Dreyer It is certified that error appears in the above-identified patent and that said Letters Patent is hereby corrected as shown below:

<u>Column 3,</u>
Line 18, "said" should be -- an --.

<u>Column 4,</u>
Line 16, before "signal exceeds", delete "input".

Signed and Sealed this

Fourth Day of November, 2003

JAMES E. ROGAN
*Director of the United States Patent and Trademark Office*